United States Patent [19]
Goto

[11] Patent Number: 4,465,528
[45] Date of Patent: Aug. 14, 1984

[54] METHOD OF PRODUCING A WALLED EMITTER SEMICONDUCTOR DEVICE

[75] Inventor: Hiroshi Goto, Yokohama, Japan

[73] Assignee: Fujitsu Limited, Kawasaki, Japan

[21] Appl. No.: 395,907

[22] Filed: Jul. 7, 1982

[30] Foreign Application Priority Data

Jul. 15, 1981 [JP] Japan .................. 56-110466
Jul. 17, 1981 [JP] Japan .................. 56-111863

[51] Int. Cl.$^3$ .......................... H01L 21/265
[52] U.S. Cl. ........................ 148/187; 148/188; 29/576 E; 29/578
[58] Field of Search ............. 148/175, 187, 1.5, 188; 29/578, 576 E

[56] References Cited

U.S. PATENT DOCUMENTS

| | | | |
|---|---|---|---|
| 4,063,973 | 12/1977 | Kirita et al. | 148/188 |
| 4,074,304 | 2/1978 | Shiba | 148/175 X |
| 4,111,726 | 9/1978 | Chen | 148/175 |
| 4,115,797 | 9/1978 | Hingarh et al. | 148/187 X |
| 4,118,250 | 10/1978 | Horng et al. | 148/1.5 |
| 4,157,269 | 6/1979 | Ning et al. | 148/1.5 |
| 4,199,380 | 4/1980 | Farrell et al. | 148/187 X |
| 4,318,751 | 3/1982 | Horng | 148/188 X |
| 4,379,001 | 4/1983 | Sakai et al. | 148/187 X |

Primary Examiner—G. Ozaki
Attorney, Agent, or Firm—Staas & Halsey

[57] ABSTRACT

A method of producing a bipolar type semiconductor device including the steps of: forming an insulating layer, consisting of an oxide film of the semiconductor substrate or a separate layer on a silicon semiconductor substrate or layer having a first conductivity type; forming a polycrystalline semiconductor layer on the insulating layer; forming a mask layer on the polycrystalline semiconductor layer; forming a first base region on the semiconductor substrate or layer by introducing an impurity of a second conductivity type, through the polycrystalline semiconductor layer; removing the polycrystalline semiconductor layer under the mask layer; forming an aperture on the insulating layer with the remaining polycrystalline semiconductor layer, or its oxide film, used as a mask; a second base region, which is placed in contact with the first base region, by introducing a second conductivity type impurity into the semiconductor substrate or layer through the aperture; and forming a first conductivity type emitter region within the second base region through the aperture.

6 Claims, 19 Drawing Figures

METHOD OF PRODUCING A WALLED EMITTER SEMICONDUCTOR DEVICE

BACKGROUND OF THE INVENTION

1. Field of the Invention

This invention relates to a method of producing semiconductor devices, particularly to a method of forming the base region and emitter region in a bipolar transistor formed in a bipolar type semiconductor device.

2. Description of the Prior Art

In a bipolar type semiconductor integrated circuit device, as a method of improving integration density, it has been proposed to realize dielectric isolation between the active element or passive element formed on the semiconductor substrate or layer by the so-called dielectric isolation method.

Such a dielectric isolation method utilizes an oxide material such as silicon dioxide, as an isolation material. The isolation material is formed by oxidizing the semiconductor substrate or layer up a the specified depth, for example, by the selective or local oxidation method using a silicon nitride film as the mask. In the formation of a bipolar type semiconductor integrated circuit device having a dielectric isolation structure for example a bipolar transistor using an oxide as an isolation material, allows the isolation region, the collector contact region forming window and the base region forming window to be formed at the same time by using a composite photo mask. Therefore, the dielectric isolation method is very effective for improving integration density because it forms small size transistors. In this method, the base region is formed by introducing the acceptor impurity using a thick oxide film formed by the selective oxidation method as a mask.

However, even in such bipolar transistor formed by the dielectric isolation method, the emitter region forming window, formed within said base region, is not self-aligned with the base region. For this reason, a sufficiently large margin for alignment is required between the emitter region forming window and the base region forming window. Therefore, if the photo mask is misaligned at the time of forming the emitter region forming window, not only the insulating film on the base region but also the field insulating film around the base region are removed by the etching, and when the specified impurity is introduced through the emitter region forming window, the emitter and collector become short-circuited. A short-circuit between the emitter and the collector naturally drastically deteriorate the production yield and the reliability of semiconductor devices.

Thus, for example, a means, as indicated in FIG. 1 to FIG. 3 has been proposed in order to eliminate the problem occurring at the time the photo mask is aligned.

In regard to FIG. 1:

(1) In accordance with said existing method, an n type silicon epitaxial layer 12, formed by the epitaxial growth method, is formed on a P type silicon (Si) semiconductor substrate 11. An n+ type buried layer 13, is selectively formed at the surface of the P type silicon substrate 11 prior to formation of the P type epitaxial layer 12.

(2) The surface of the n type epitaxial layer 12 is selectively or locally oxidized using as the mask a silicon nitride ($Si_3N_4$) layer (not shown) and a field insulating layer 14 consisting of silicon dioxide ($SiO_2$) is formed.

(3) The silicon nitride layer is removed.

(4) A polycrystalline silicon layer 15 is formed covering the field insulating layer and exposed n type epitaxial layer 12.

(5) The P type base region 16 is then formed by introducing the acceptor impurity through the polycrystalline silicon layer 15.

(6) Moreover, the P+ type base contact region 17 is formed by depositing a photoresist layer (not shown) on the polycrystalline silicon layer 15 and by introducing, the acceptor impurity in a high concentration with the photoresist used as a mask.

In regard to FIG. 2:

(7) The silicon nitride film pattern 18a corresponding to the emitter region forming window and the emitter electrode contact window and the silicon nitride film pattern 18b corresponding to the base electrode contact window are formed on the polycrystalline silicon layer 15.

(8) The polycrystalline silicon layer 15 is selectively oxidized using the silicon nitride film patterns 18a and 18b as a mask, thereby converting the unmasked polycrystalline silicon layer and a part of the surface of the P type silicon layer 12, located thereunder, to a silicon dioxide film 19.

In regard to FIG. 3:

(9) The silicon nitride film patterns 18a and 18b are then removed. As a result, the underlying polycrystalline silicon layers 15a and 15b are exposed.

(10) The n+ type emitter region 20 is formed by introducing the donor impurity in a high concentration into the exposed region through the polycrystalline silicon layer 15a by ion implantation with a photo resist (not shown) mask or by solid to solid diffusion.

(11) The emitter electrode 21 and base electrode 22 are formed by depositing a metal material such as aluminum (Al) on the polycrystalline silicon layers 15a, 15b. In such a method, the window opening formation, using photo etching, is carried out before the emitter region is formed.

Therefore, if a part of the emitter region is in contact with a field insulating layer, the short-circuit between the emitter and collector, as explained previously, does not occur.

As a result, such a method realizes a so-called walled emitter structure where a part of the emitter region is placed in contact with the field insulating layer. This walled emitter structure is effective for reducing the area occupied by the transistor and also effective for realizing high integration density and high performance of the bipolar type integrated circuit device.

According to the method shown in FIG. 1 to FIG. 3, the insulating film 19a which isolates the emitter region forming window/emitter electrode window and the base electrode window is formed from the oxide material created from the polycrystalline silicon layer 15, and oxidation of the surface of the silicon epitaxial layer under the polycrystalline silicon layer 15. The insulating film formed by the oxidation of the polycrystalline silicon layer is comparatively porous and has low insulation characteristics. In addition, a crystal defect is induced at the epitaxial layer surface (boundary to the oxide film) under the oxide film by selective oxidation of the silicon epitaxial layer surface using the silicon nitride film pattern as a mask. Therefore, a bipolar type semiconductor device formed by such a method does not sufficiently improve the electrical characteristic and reliability.

SUMMARY OF THE INVENTION

It is an object of the present invention to provide a method of producing a bipolar semiconductor device which eliminates disadvantages of the conventional methods and ensures excellent electrical characteristics and reliability.

It is another object of the present invention to provide a method of producing a bipolar semiconductor device wherein the emitter region can be formed by the self-alignment, within the base region, of a bipolar transistor.

It is a further object of the present invention to provide a method of producing the so-called walled emitter type bipolar transistor including a process for producing the base and emitter regions which successfully prevents the short-circuit between a emitter and collector of a bipolar transistor.

For this purpose, the present invention proposes a method of producing a semiconductor device comprising the steps of:

forming an insulating layer on a semiconductor substrate having a first conductivity type, forming a polycrystalline semiconductor layer on the insulating layer, introducing a second conductivity type impurity into the semiconductor substrate using a mask layer formed on the polycrystalline semiconductor layer, eliminating the mask layer and the polycrystalline semiconductor layer thereunder, forming an aperture on the insulating layer using the remaining polycrystalline semiconductor layer or its oxide film as a mask, introducing the second conductivity type impurity into the semiconductor substrate through said aperture, and introducing selectively the first conductivity type impurity into the region, where said second conductivity type impurity has been introduced, through the aperture.

DESCRIPTION OF THE PREFERRED EMBODIMENTS

Figure 1:
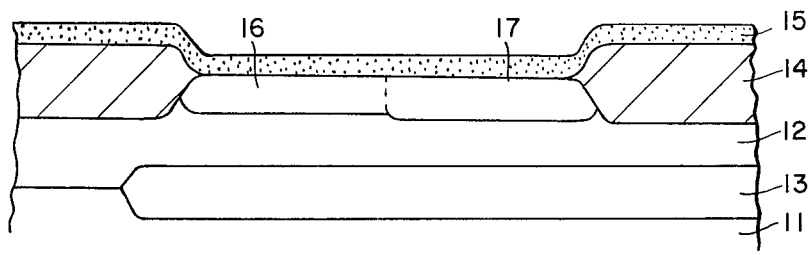
FIG. 1 to FIG. 3 are sectional views indicating the conventional producing processes for a bipolar transistor.
Figure 2:
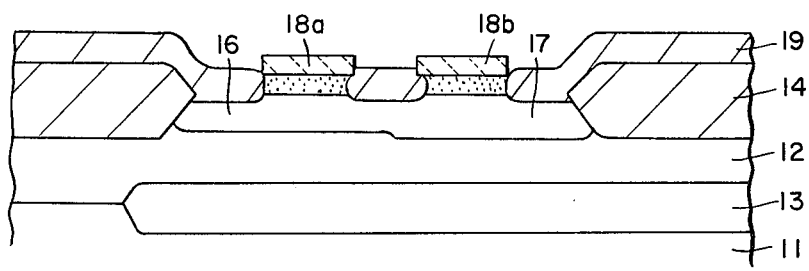
Figure 3:
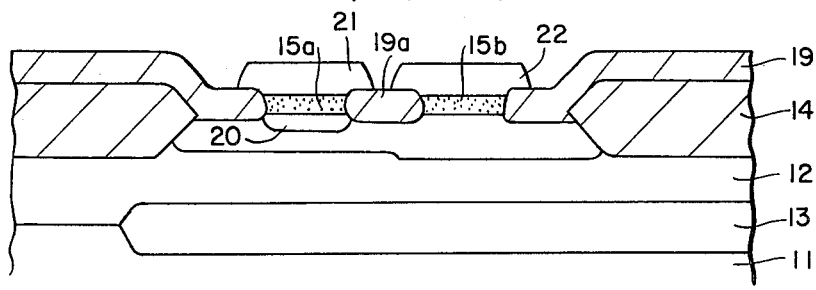
Figure 4:
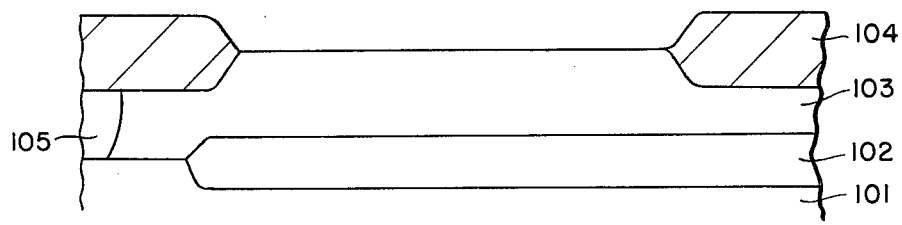
FIG. 4 to FIG. 13 are sectional views indicating the stages of the first embodiment of the method of producing a bipolar transistor of the present invention.

FIG. 4 to FIG. 13 show processes of the first embodiment of a method of producing a bipolar transistor in relation to the present invention. Such drawings are sectional views along the line A-A' in the plan view shown in FIG. 14. In regard to FIG. 4:

(1) An n+ type buried layer 102 is formed on the surface of the P type silicon substrate 101 by selectively introducing the donor impurity, for example, antimony (Sb) or arsenic (As).

(2) An n type silicon epitaxial layer 103 is formed on the P type silicon substrate 101 containing the n+ type buried layer 102.

(3) The surface of the n type epitaxial layer 103 is oxidized by the selective oxidation method, for example, using a silicon nitride film (not shown) as a mask, and thereby, a field insulating layer 104, consisting of silicon dioxide ($SiO_2$), is formed.

These processes can be executed by existing well known production processes. In the structure shown in FIG. 4, the field insulating layer 104 defines the region wherein the base region is to be formed. In addition, on the epitaxial layer 103 under the field insulating layer 104, a P+ type isolation region 105, which extends to the silicon substrate 101 from the lower surface of said field insulating layer 104, is deposited.

Figure 5:
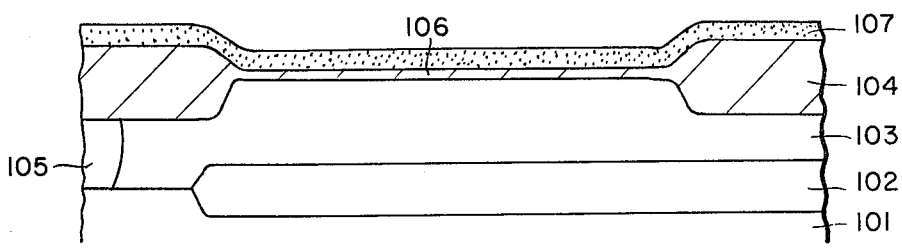

In regard to FIG. 5:

(4) The exposed surface of the epitaxial layer 103, defined by said field insulating layer 104, is then oxidized and a silicon dioxide layer 106 is formed to a thickness of 1000 to 3000 Å. Such oxidation processing can be realized by existing well known thermal oxidation method.

(5) A nondoped polycrystalline silicon layer 107 is formed to a thickness of 1000 Å covering the surface of the silicon dioxide layer 106 and the field insulating layer 104. Such polycrystalline silicon layer 107 is formed, for example, by the chemical vapor deposition method using the monosilane ($SiH_4$).

Figure 6:
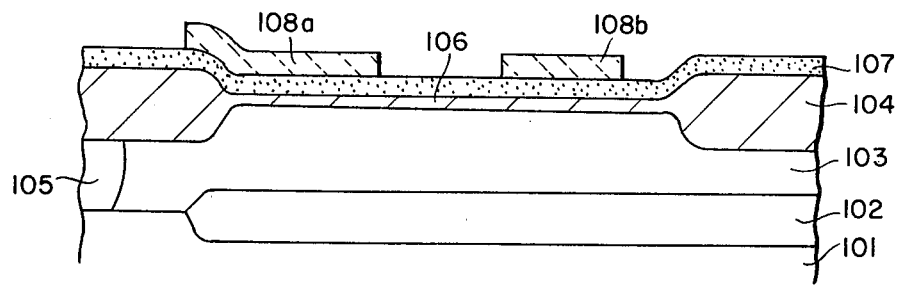

In regard to FIG. 6:

(6) A photoresist layer, which defines the emitter region forming window/emitter electrode window and the base electrode window forming region, is formed on the polycrystalline silicon layer 107. The photoresist layer 108a defines the emitter region forming window/emitter electrode window, while the photoresist layer 108b defines the base electrode window.

Figure 7:
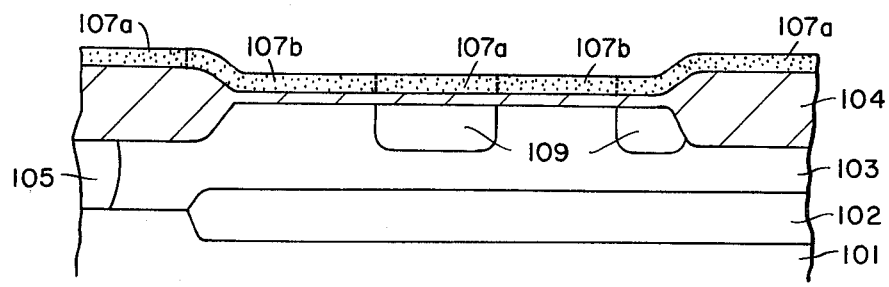

In regard to FIG. 7:

(7) The acceptor impurity, for example, boron (B), is implanted by the ion implantation using the photoresist layers 108a and 108b and the field insulating layer 104 as a mask. Such ion implantation is carried out in a condition, for example, where the acceleration voltage is 60 KeV ~ 100 KeV and the dosage is $10^{15}$ to $10^{16}$ atoms/$cm^2$.

(8) The photoresist layer 108 is removed.

(9) A P type base region 109 is formed, for example, by annealing in a nitrogen ($N_2$) atmosphere at 900° C. in order to activate the boron ions. The base region is formed, for example, with a depth of 3000 to 4000 Å and a surface sheet resistance of 400 ohms/square.

Simultaneously with the formation of the base region 109, a conductivity is given to the region 107a not covered with the photoresist 108 on said polycrystalline silicon layer 107.

Figure 8:
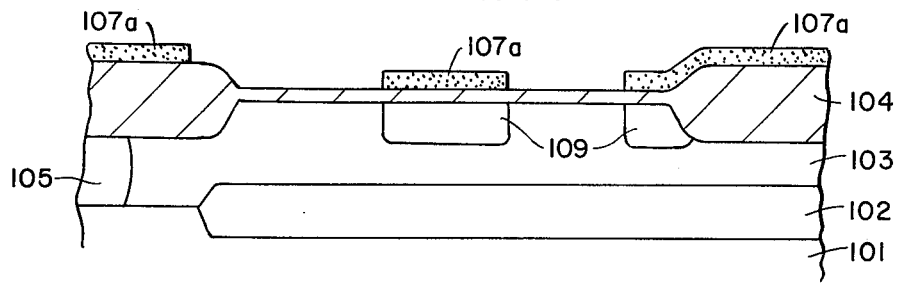

In regard to FIG. 8:

(10) The region to which impurity (boron) was not introduced into the polycrystalline silicon layer 107, namely the region 107b covered with said photoresist layer 108 is removed by etching. As the etching solution for the nondoped polycrystalline silicon region 107b, an aqueous solution of the potassium hydroxide (KOH) in concentration of 10 to 30% (weight %) is used. The ratio of the etching rate to the nondoped polycrystalline silicon and the P type silicon for such an aqueous solution of potassium hydroxide is 10:1 and the amount of etching of the P type polycrystalline layer 107a in the etching process is very small.

Figure 9:
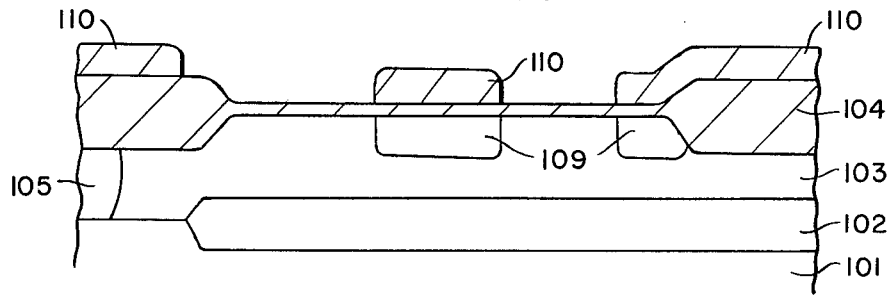

In regards to FIG. 9:

(11) The polycrystalline layer 107a is oxidized and is converted to a silicon dioxide layer 110. The thickness of said silicon dioxide layer 110 is about 2000 Å.

Figure 10:
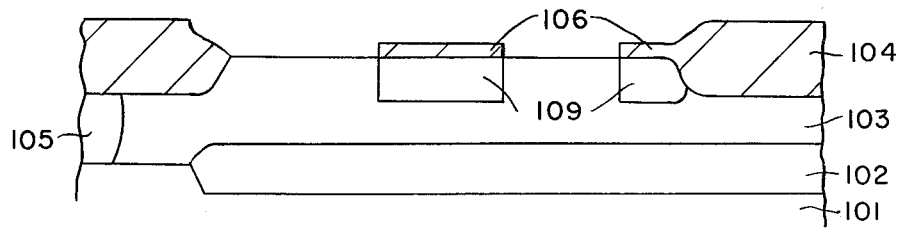

In regard to FIG. 10:

(12) The silicon dioxide layer 110 is removed by the etching method. At this time, the silicon dioxide layer 106 not covered with the silicon dioxide layer 110 is removed by the etching and the silicon epitaxial layer 103 under the silicon dioxide layer 106 is thus selectively exposed. For removal of the silicon dioxide layers 110, 106, wet etching using an etching solution of hydro fluoric acid (HF) or a dry etching using methane trifluoride ($CHF_3$) can be used.

Figure 11:
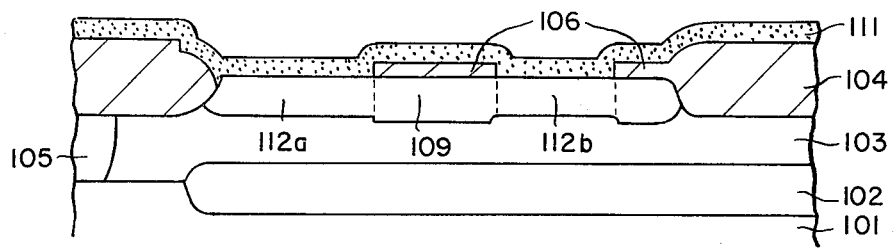

In regard to FIG. 11:

(13) A polycrystalline silicon layer 111 of about 1000 Å, is formed to cover the exposed portion of said silicon epitaxial layer 103, the remaining portion of the silicon dioxide layer 106 and the field insulating layer 104.

(14) Boron ions (B+) are implanted through the polycrystalline silicon layer 111 using the remaining silicon dioxide layer 106 and the field insulating layer 104 as a mask. Ion implantation is carried out using an accelerating voltage of 40 KeV and a dose of $10^{14}$ atoms/cm$^2$.

(15) The P type base regions 112a and 112b are formed in contact with the P type base region 109 by annealing for example, under a nitrogen ambient at 900° C. in order to activate the boron ions. The base regions 112a and 112b have the depth of 3000 Å and a surface sheet resistance of 800 ohms/square. The field insulating layer 104 is in contact with a parts of the base regions 112a and 112b.

Figure 12:
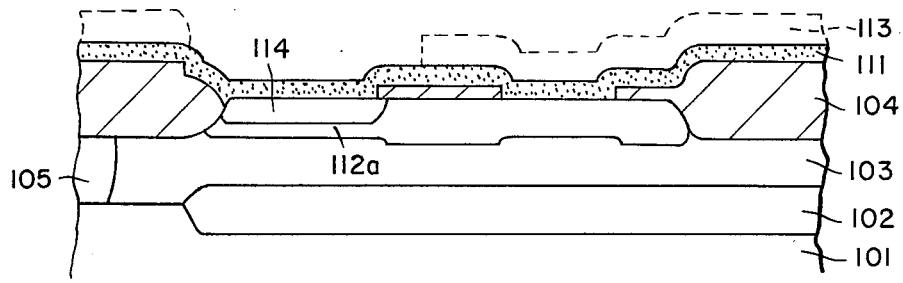

In regard to FIG. 12:

(16) A photoresist layer 113 is deposited covering the base region 112b.

(17) The donor impurity, for example, arsenic (As), is ion-implanted onto the base region 112a through the polycrystalline silicon layer 111 using the photo resist layer 113, the field insulating layer 104 and the silicon dioxide layer 106 as a mask. This ion implantation is carried out with an acceleration voltage of 70 KeV and a dose of $10^{16}$ atoms/cm$^2$.

(18) The photoresist layer 113 is removed.

(19) An n+ type emitter region 114 is formed in the vicinity of the surface of the base region 112a by annealing, for example, under a nitrogen ambient at 900° C. in order to drive-in the arsenic ion. The emitter region 114 has a depth of 2000 Å and a surface impurity concentration of $10^{20}$ atoms/cm$^3$. A part of the emitter region 114 contacts the field insulating layer 104 creating a so-called walled emitter structure.

Figure 13:
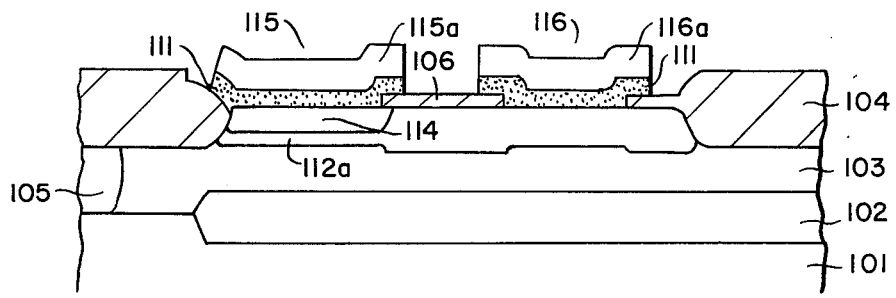
Figure 14:
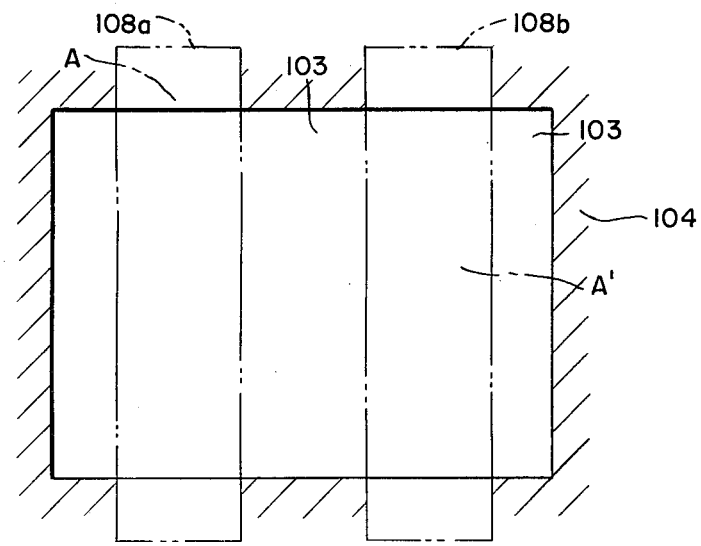
FIG. 14 is a plan view indicating the structure of a bipolar transistor in accordance with the first embodiment of the present invention.

In regard to FIG. 13:

(20) An electrode metal material, for example, aluminum, is deposited to a thickness of 1 μm on the polycrystalline silicon layer 111.

(21) The electrode layer and the polycrystalline silicon layer 111 thereunder are selectively etched using a photoresist layer (not shown) as a mask and the emitter electrode 115 and base electrode 116 are thus formed. The upper layers 115a, 116a of each electrode are aluminum layers.

A bipolar transistor structure can be realized by the above production processes, but if necessary, the multilayered wiring structure can be configured by a well known technique and thereafter a passivation film, such as a phosphosilicate glass (PSG) can be deposited (not shown).

The collector electrode leadout portion, not shown, is formed by the following means. Namely, in the case of forming the field insulating layer by thermal oxidation of the surface of the epitaxial layer exposed within the base region forming window, the silicon nitride film is retained within the collector contact window for the use as the mask.

Prior to formation of the base region, the collector contact region is formed, as usual, by the ion implantation of the donor impurity but the base region forming window is covered with a resist film.

During the ion implantation of the P type impurity in order to form the base region (processes shown in FIG. 7 and FIG. 11), the collector contact window is covered with a photoresist film.

The donor impurity introduced to form the emitter region is simultaneously introduced into the collector contact window. The polycrystalline silicon layer is also formed and deposited within the collector contact window.

In the above embodiment, the N+ type emitter region is formed by ion implantation but the emitter region can be formed by solid to solid diffusion from the phosphosilicate glass (PSG) film.

In addition, it is also possible, in this embodiment, to provide a silicon nitride layer ($Si_3N_4$) of 500 to 700 Å between the silicon dioxide layer 106 and polycrystalline silicon layer 107. Such a structure is capable of improving the etching accuracy of the silicon dioxide layer 107.

FIG. 15 to FIG. 19 show the second embodiment of a method of producing a bipolar transistor of the present invention.

In this second embodiment, the processes of formation of the field insulating layer on the surface of the n type epitaxial layer through the selective formation of the base region and removal of the nondoped polycrystalline silicon layer, namely the processes shown in FIG. 4 to FIG. 8 in the first embodiment are the same. Therefore, explanations and drawings of such processes are omitted here.

For explanation of this embodiment, the numbering given to each portion described for said first embodiment is also given in the same way to this embodiment.

Figure 15:
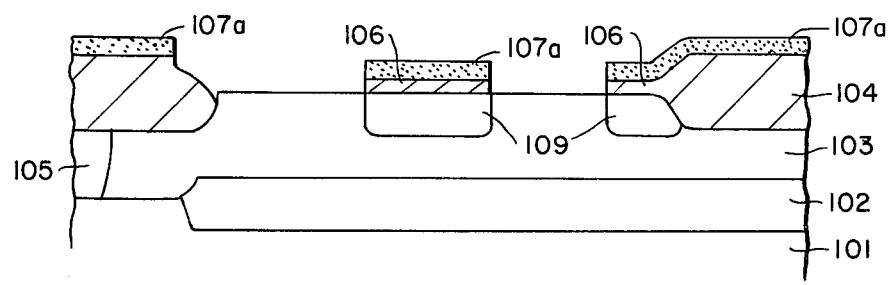
FIG. 15 to FIG. 19 are views indicating the stages of the second embodiment of the method of producing a bipolar transistor in relation to the present invention.

In regard to FIG. 15:

(1) The silicon dioxide layer 106 is selectively removed by etching using the remaining P type polycrystalline silicon layer 107a as a mask.

For removal of silicon dioxide layer 106, a reactive ion etching method using methane trifluoride ($CHF_3$) as the etchant is employed.

The silicon epitaxial layer 103 is selectively exposed by such etching process.

Figure 16:
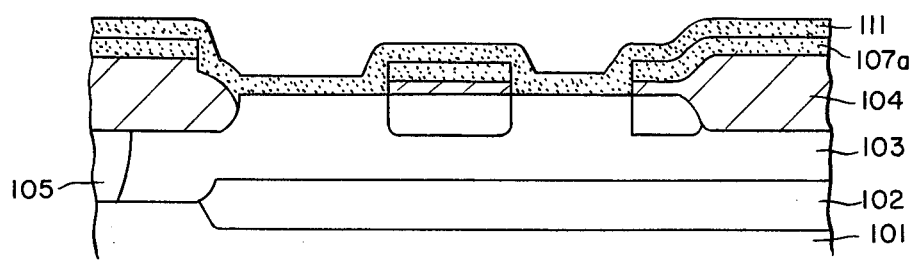
Figure 17:
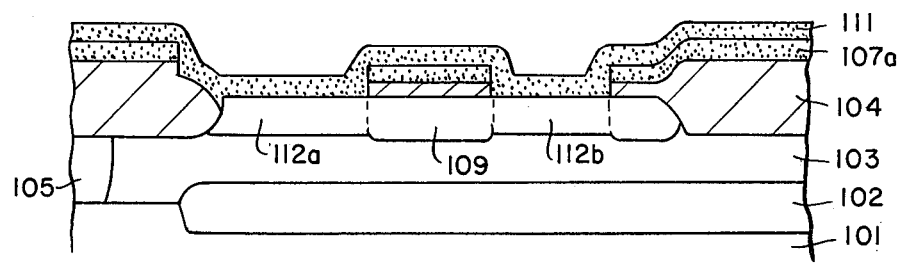

In regard to FIG. 16:

(2) A polycrystalline silicon layer 111 is formed to a thickness of 1000 Å covering the exposed portion of said silicon epitaxial layer 103 and the polycrystalline silicon layer 107a.

The polycrystalline silicon layer 111 can be formed as explained above by chemical vapor deposition using monosilane ($SiH_4$).

In regard to 17:

(3) Boron ions (B+) are implanted through the polycrystalline silicon layer 111 using the silicon dioxide layer 106 and the field insulating layer 104 as a mask. The ion implantation is carried out with an acceleration voltage of 40 KeV and a dose of $10^{14}$ atoms/cm$^2$.

(4) The P type base regions 112a and 112b are formed in contact with the P type base region 109 by annealing under a nitrogen ambient, at, for example, 900° C. in order to activate the boron ions. Such base regions 112a and 112b have a depth of 3000 Å and the surface sheet resistance is 800 ohms/square. A part of such base regions 112a, 112b is placed in contact with the field insulating layer 104.

Figure 18:
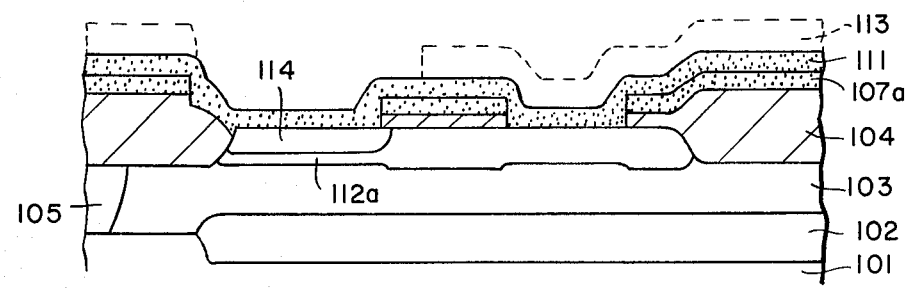

In regard to FIG. 18:

(5) A photoresist layer 113 is deposited exposing only base region 112a.

(6) A donor impurity, for example, arsenic (As) is ion-implanted into the base region 112a through the polycrystalline silicon layer 111 with the photoresist layer 113, the field insulating layer 104 and the silicon dioxide layer 106 used as a mask. Such ion implantation is carried out with an acceleration voltage of 70 KeV and a dose of $10^{16}$ atoms/cm$^2$.

(7) The photoresist layer 113 is removed.

(8) The n+ type emitter region 114 is formed in the vicinity of surface of the base region 112a by annealing under a nitrogen ambient at, for example, 900° C. in order to drive-in the arsenic ions. The emitter region 114 has the depth of 2000 Å and a surface impurity concentration of $10^{20}$ atoms/cm$^3$. A part of the emitter region 114 is in contact with the field insulating layer 104.

Figure 19:
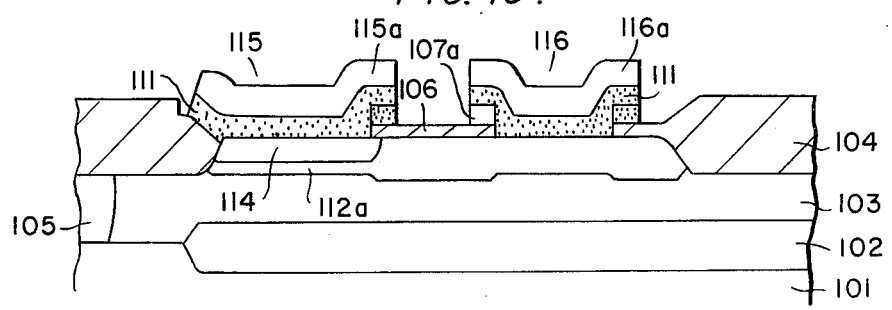

In regard to FIG. 19:

(9) The electrode metal material, for example, aluminum is deposited to a thickness of about 1 μm on said polycrystalline silicon layer 111.

(10) The aluminum layer and the polycrystalline silicon layers 111 and 107a are removed by selective etching with a photoresist layer (not shown) used as a mask and the emitter electrode 115 and the base electrode 116 are formed. The upper portions 115a, 116a, of each electrode are aluminum layers.

By the above processes a bipolar transistor structure can be realized. If necessary, the multilayered wiring structure can be formed by a well known technique and thereafter a passivation film such as phosphosilicate glass is deposited (not shown).

Also, in the case of this second embodiment, the collector electrode leadout portion (not shown) can be formed by the same method as described for the first embodiment.

According to above method of producing a bipolar transistor of the present invention, the insulating film which protects the exposed portion of the emitter-base junction and electrically isolates the emitter and base electrodes is the silicon dioxide layer 106 formed by directly oxidizing the surface of the silicon epitaxial layer. The dioxide layer 106 is much denser than the silicon dioxide layer formed by oxidizing the polycrystalline silicon as in the case of the prior art. Moreover, a mask such as the silicon nitride film etc. is not used for forming the silicon dioxide layer 106. In addition, according to the present invention, the base region 112a and emitter region 114 are formed through an aperture formed in the silicon dioxide layer formed, on the surface of the silicon epitaxial layer. Therefore, the emitter region 114 is self-aligned with the base region 112a, resulting in the so-called walled emitter structure.

According to the present invention, the insulating film, which electrically isolates the emitter and base electrodes has a high insulation characteristic and does not place any thermal or mechanical stress or create any crystal defects on the semiconductor layer just under said the insulating film. Therefore, the present invention provides a bipolar semiconductor device which does not have poor insulation between the emitter and base electrodes. In addition, the present invention is capable of forming an emitter region which is self-aligned to the base region, therefore realizing the so-called walled emitter structure. Resultingly, it is not necessary to provide a margin of alignment for the base region around the emitter region forming window, thus, reducing the area of said base region.

Reduction in the size of the base region brings about a reduction in the size of the pertinent bipolar transistor which is desirable for a high integration density of a bipolar integrated circuit including said bipolar transistor.

Moreover, reduced base region size contributes to a reduction of the parasitic capacitance between the base and collector and is also effective for improving the electrical characteristics of the pertinent transistor in combination with the reduction of the parasitic capacitance between the emitter and base.

Namely, according to the present invention, a bipolar transistor having high reliability and high integration density can be produced with a high production yield.

I claim:

1. A method of producing semiconductor devices comprising the steps of:
    (a) forming an insulating layer on a semiconductor substrate, the substrate having a first conductivity type;
    (b) forming a polycrystalline semiconductor layer on the insulating layer;
    (c) forming a mask layer on the polycrystalline semiconductor layer;
    (d) introducing a second conductivity type impurity into the semiconductor substrate using the mask layer, formed on the polycrystalline semiconductor layer, as the mask;
    (e) removing the mask layer and the polycrystalline semiconductor layer thereunder;
    (f) selectively forming an aperture in the insulating layer;
    (g) introducing a second conductivity type impurity into the semiconductor substrate through the aperture to a first level; and
    (h) selectively introducing a first conductivity type impurity to a second level and into the region where the second conductivity type impurity has been introduced, through the aperture.

2. A method of producing semiconductor devices according to claim 1, wherein the semiconductor substrate is composed of silicon.

3. A method of producing semiconductor devices according to claim 1, wherein the insulating layer is a silicon dioxide layer formed by oxidizing the surface of the semiconductor substrate.

4. A method of producing semiconductor devices according to claim 1, wherein the polycrystalline semiconductor layer is composed of polycrystalline silicon.

5. A method of producing semiconductor devices according to claim 1, wherein step (f) includes the steps of:
    (i) oxidizing the remaining polycrystalline semiconductor layers; and
    (ii) forming the aperture using the oxidized polycrystalline semiconductor layer as a mask.

6. A method of producing semiconductor devices according to claim 1, wherein step (f) includes using the remaining polycrystalline semiconductor layer as a mask.

* * * * *

UNITED STATES PATENT AND TRADEMARK OFFICE
CERTIFICATE OF CORRECTION

PATENT NO. : 4,465,528

DATED : August 14, 1984

INVENTOR(S) : Hiroshi Goto

It is certified that error appears in the above-identified patent and that said Letters Patent is hereby corrected as shown below:

Col. 1, line 19, "material" (first occurrence) should be --material,--;

line 25, "structure for example" should be --structure, for example,--;

line 26, "transistor" should be --transistor,--; "material," should be --material--;

line 50, start new paragraph with "A short-circuit".

Col. 2, line 12, "introducing," should be --introducing--;
line 39, "(Al)" should be --(A$\ell$)--.

Col. 3, line 19, "the" should be --a--; "a" should be --the--;

line 67, "the" should be --a--.

UNITED STATES PATENT AND TRADEMARK OFFICE
CERTIFICATE OF CORRECTION

PATENT NO. : 4,465,528

DATED : August 14, 1984

INVENTOR(S) : Hiroshi Goto

It is certified that error appears in the above-identified patent and that said Letters Patent is hereby corrected as shown below:

Col. 4, line 7, "and" should be. --and,--.

Col. 5, line 12, "hydro" should be --hydro- --;
      line 16, "111" should be --111,--;
      line 37, "The" should be --A--.

Col. 7, line 58, "formed," should be --formed--;
      line 67, delete "said".

Signed and Sealed this

Fifth Day of March 1985

[SEAL]

Attest:

DONALD J. QUIGG

Attesting Officer    Acting Commissioner of Patents and Trademarks